US012615742B2

(12) United States Patent
Wan et al.

(10) Patent No.: US 12,615,742 B2
(45) Date of Patent: Apr. 28, 2026

(54) HOUSING AND ELECTRONIC DEVICE

(71) Applicant: Honor Device Co., Ltd., Shenzhen (CN)

(72) Inventors: Weijian Wan, Shenzhen (CN); Yongqing Luo, Shenzhen (CN); Jinyu Chen, Shenzhen (CN)

(73) Assignee: HONOR DEVICE CO., LTD., Shenzhen (CN)

( * ) Notice: Subject to any disclaimer, the term of this patent is extended or adjusted under 35 U.S.C. 154(b) by 302 days.

(21) Appl. No.: 18/006,182

(22) PCT Filed: Sep. 7, 2022

(86) PCT No.: PCT/CN2022/117576
§ 371 (c)(1),
(2) Date: Jan. 20, 2023

(87) PCT Pub. No.: WO2023/098206
PCT Pub. Date: Jun. 8, 2023

(65) Prior Publication Data
US 2024/0130084 A1 Apr. 18, 2024

(30) Foreign Application Priority Data
Nov. 30, 2021 (CN) .......................... 202111436285.X

(51) Int. Cl.
*H05K 7/20* (2006.01)
(52) U.S. Cl.
CPC ................................ *H05K 7/20336* (2013.01)
(58) Field of Classification Search
CPC ........... H05K 7/20336; H05K 7/20663; H05K 7/2029; H05K 7/2039
See application file for complete search history.

(56) References Cited

U.S. PATENT DOCUMENTS

| | | | |
|---|---|---|---|
| 10,211,514 B2 * | 2/2019 | Jung | H05K 7/2039 |
| 10,368,457 B2 * | 7/2019 | Pakula | H05K 7/14 |

(Continued)

FOREIGN PATENT DOCUMENTS

| | | |
|---|---|---|
| CN | 202906989 U | 4/2013 |
| CN | 104822238 A | 8/2015 |

(Continued)

OTHER PUBLICATIONS

JP-2019196886-A Translation (Year: 2019).*
WO-2021186686-A1 Translation (Year: 2021).*
CN-112702892-A Translation (Year: 2021).*

*Primary Examiner* — Jacob R Crum
*Assistant Examiner* — Matthew Sinclair Muir
(74) *Attorney, Agent, or Firm* — Conley Rose, P.C.

(57) ABSTRACT

A housing and an electronic device. The housing includes a first support plate, a second support plate, and a vapor chamber. The first support plate, the vapor chamber, and the second support plate are laminated, and the vapor chamber is located between the first support plate and the second support plate, and is connected to the first support plate and the second support plate. Heat dissipation channels are disposed on the vapor chamber, the heat dissipation channels include a main heat dissipation channel and an auxiliary heat dissipation channel, the main heat dissipation channel and the auxiliary heat dissipation channel are connected, and heat exchange may occur between the main heat dissipation channel and the auxiliary heat dissipation channel. The housing may improve heat dissipation performance of the housing.

20 Claims, 4 Drawing Sheets

(56)     References Cited

U.S. PATENT DOCUMENTS

| | | | | |
|---|---|---|---|---|
| 2007/0035739 A1* | 2/2007 | Tung | ................... | H04M 1/0283 |
| | | | | 356/445 |
| 2014/0138057 A1* | 5/2014 | Horng | ................ | F28D 15/0233 |
| | | | | 165/104.21 |
| 2016/0131440 A1* | 5/2016 | Lee | .................... | F28D 15/0233 |
| | | | | 165/185 |
| 2017/0307299 A1* | 10/2017 | Huang | .................... | F28D 15/02 |
| 2019/0254190 A1* | 8/2019 | Shiau | ..................... | F28D 15/02 |
| 2019/0335619 A1* | 10/2019 | Tseng | .................... | H01L 23/427 |
| 2022/0329677 A1* | 10/2022 | Wu | ........................ | H01Q 1/243 |

FOREIGN PATENT DOCUMENTS

| | | | | | |
|---|---|---|---|---|---|
| CN | 208370081 U | | 1/2019 | | |
| CN | 110010569 A | | 7/2019 | | |
| CN | 110234216 A | | 9/2019 | | |
| CN | 111536817 A | | 8/2020 | | |
| CN | 111637772 A | | 9/2020 | | |
| CN | 112702892 A | * | 4/2021 | ......... | H01M 10/613 |
| CN | 112996346 A | | 6/2021 | | |
| CN | 113873858 A | | 12/2021 | | |
| JP | 2019196886 A | * | 11/2019 | | |
| WO | WO-2021186686 A1 | * | 9/2021 | | |

\* cited by examiner

HOUSING AND ELECTRONIC DEVICE

CROSS-REFERENCE TO RELATED APPLICATIONS

This application is a U.S. National Stage of International Application No. PCT/CN2022/117576 filed on Sep. 7, 2022, which claims priority to Chinese Patent Application No. 202111436285.X, filed with the China National Intellectual Property Administration on Nov. 30, 2021, both of which are incorporated herein by reference in their entireties.

TECHNICAL FIELD

This application relates to the field of electronic product technologies, and in particular, to a housing and an electronic device.

BACKGROUND

With the development of science and technology, electronic devices (such as a mobile phone and a tablet computer) gradually develop towards lightening and thinning. A rear cover made of a plastic material facilitates lightening and thinning of the electronic devices. However, heat conductivity of plastic is poor, causing poor heat dissipation performance of the electronic devices and affecting overall performance of electronic devices.

SUMMARY

This application provides a housing, so as to resolve a technical problem of poor heat dissipation performance of a housing in the conventional technology.

According to a first aspect, this application provides a housing. The housing includes a first support plate, a second support plate, and a vapor chamber. The first support plate, the vapor chamber, and the second support plate are laminated, and the vapor chamber is located between the first support plate and the second support plate, and is connected to the first support plate and the second support plate. Heat dissipation channels are disposed on the vapor chamber, the heat dissipation channels include a main heat dissipation channel and an auxiliary heat dissipation channel, the main heat dissipation channel and the auxiliary heat dissipation channel are connected, and heat exchange may occur between the main heat dissipation channel and the auxiliary heat dissipation channel.

In this embodiment, the vapor chamber is disposed between the first support plate and the second support plate, so that a heat dissipation effect of the housing can be improved. In addition, the vapor chamber further has a heat equalization function. The heat exchange between the main heat dissipation channel and the auxiliary heat dissipation channel allows the heat transferred from the first support plate to the vapor chamber to be evenly distributed to an entire vapor chamber, thereby improving heat dissipation efficiency of the housing, and improving performance and service life of an electronic device. In addition, the vapor chamber has high strength, and the vapor chamber is disposed between the first support plate and the second support plate, so that strength of the housing can be improved, and flatness of the housing can be reduced.

In an implementation, the vapor chamber includes a low-temperature area and a high-temperature area connected to the low-temperature area. The vapor chamber is filled with coolant, which can be vaporized in the high-temperature area and condensed in the low-temperature area, so that heat in the high-temperature area can be conducted to the low-temperature area. In this embodiment, a temperature of the high-temperature area is higher than that of the low-temperature area, and the heat in the high-temperature area is conducted to the low-temperature area, so that heat of the vapor chamber can be evenly distributed, thereby improving the heat dissipation efficiency of the housing.

In an implementation, a capillary structure is disposed in the heat dissipation channel, the coolant is filled in the capillary structure, and the coolant may undergo a gas-liquid circulation in the main heat dissipation channel and the auxiliary heat dissipation channel, so that the heat in the high-temperature area is conducted to the low-temperature area.

In this embodiment, the coolant in the high-temperature area is heated to vaporize, absorbs heat, and rapidly expands. The vaporized coolant rapidly fills an entire heat dissipation channel. When the vaporized coolant is in contact with the low-temperature area, it condenses and releases heat accumulated during vaporization. The condensed coolant passes through the capillary structure and then returns to the high-temperature area in the vapor chamber. After continuous circulation, in a process of vaporization and condensation, the coolant continuously transfers heat in the high-temperature area of the vapor chamber to the low-temperature area, so as to achieve a heat equalization effect, so that heat of the vapor chamber is evenly distributed in the entire vapor chamber, thereby improving a heat dissipation effect.

In an implementation, the heat dissipation channel further includes a guide channel, one end of the guide channel is connected to the main heat dissipation channel, the other end is connected to the auxiliary heat dissipation channel, and the main heat dissipation channel and the auxiliary heat dissipation channel are connected to the guide channel. A width of the guide channel is less than widths of the main heat dissipation channel and the auxiliary heat dissipation channel.

In this embodiment, because the width of the guide channel is set to be less than the widths of the main heat dissipation channel and the auxiliary heat dissipation channel, the vaporized coolant flows more quickly when passing through the guide channel, so that heat transfer between the main heat dissipation channel and the auxiliary heat dissipation channel can be accelerated, a heat equalization effect of the vapor chamber is improved, and the heat dissipation efficiency of the housing is improved.

In an implementation, a material of the vapor chamber is copper, a carbon fiber, graphene, or graphite flake. The vapor chamber prepared from the copper or carbon fiber has excellent heat conductivity, high strength, and good ductility. When the vapor chamber is applied to the housing, heat dissipation performance, strength, and toughness of the housing can be improved. The vapor chamber prepared from the graphene or graphite flake has excellent heat conductivity, so that the heat dissipation performance of the housing can be improved.

In an implementation, a thickness of the housing is 0.5-0.65 mm.

In an implementation, the housing further includes a protection plate, the protection plate is provided with an accommodation groove, and the vapor chamber is located in the accommodation groove, and is fixedly connected to the protection plate. In this embodiment, a protection plate is disposed, and the vapor chamber is mounted in an accommodation groove of the protection plate, so that the protection plate can protect the vapor chamber. In addition, the protection plate may further avoid exposure of the vapor chamber from an edge area, which does not affect an appearance design of a housing 100 and improves aesthetic appearance of the housing.

In an implementation, a mounting groove is disposed on a surface that is of the first support plate and that faces the vapor chamber, and the vapor chamber is located in the mounting groove; or a mounting groove is disposed on a surface that is of the second support plate and that faces the vapor chamber, and the vapor chamber is located in the mounting groove. In this embodiment, a mounting groove is directly disposed on the first support plate or the second support plate, the vapor chamber is mounted in the mounting groove, and no additional protection plate needs to be disposed, so that a structure of the housing can be simplified, and weight of the housing can be further reduced.

In an implementation, a mounting groove is disposed on the surface that is of the first support plate and that faces the vapor chamber, a mounting groove is disposed on the surface that is of the second support plate and that faces the vapor chamber, and the mounting groove of the first support plate is buckled with the mounting groove of the second support plate to fasten the vapor chamber. In this embodiment, mounting grooves are directly disposed on the first support plate and the second support plate, the vapor chamber is mounted in the mounting groove, and no additional protection plate needs to be disposed, so that the structure of the housing can be simplified, and the weight of the housing can be further reduced.

In an implementation, the housing is an integrally formed component. In this embodiment, two-step injection molding or multi-step injection molding may be used to prepare an integrally formed housing, so that structural stability of the housing can be improved.

In an implementation, the housing includes a decorative layer, and the decorative layer is laminated on a surface that is of the first support plate and that faces away from the vapor chamber. In this embodiment, the decorative layer is disposed, so that the aesthetic appearance of the housing can be improved, and handfeel of a user can be further improved. In addition, the decorative layer may further protect the first support plate.

In an implementation, the decorative layer is formed on a surface of the first support plate by using a spraying or non-conductive coating process. In this embodiment, a decorative layer formed by using a NCVM (NCVM) technology has a metal coating mirror effect, has a rich color, and can improve the aesthetic appearance of the housing. In addition, the decorative layer formed by using the NCVM technology has a high resistivity, which can avoid affecting communication performance of the electronic device. The decorative layer is formed by using a spraying process, so that a process can be simplified.

In an implementation, the housing includes an ink layer, and the ink layer is laminated on a surface that is of the second support plate and that faces away from the vapor chamber. In this embodiment, the ink layer is formed on a surface of the second support plate by using the spraying process. Disposing the ink layer can improve the aesthetic appearance of the housing, and at the same time, the ink layer protects the second support plate.

According to a second aspect, this application provides an electronic device, including a body and the foregoing housing, where the housing is mounted in the body. The electronic device provided in this embodiment has a small thickness and a light weight. In addition, strength and toughness of the housing are high, which improves anti-drop performance and durability of the electronic device. In addition, flatness of the housing is small, so that appearance smoothness of the electronic device is improved, and user experience is improved.

In an implementation, the vapor chamber includes a low-temperature area and a high-temperature area, a first heating element and a second heating element are mounted in the body, heat of the first heating element is greater than heat of the second heating element, and the high-temperature area is opposite to the first heating element.

In this embodiment, heat generated by the first heating element may be transferred to a high-temperature area of the vapor chamber, and heat generated by the second heating element may be transferred to a low-temperature area. In addition, a temperature of the high-temperature area is higher than that of the low-temperature area, and heat in the high-temperature area may be conducted to the low-temperature area, so that heat of the vapor chamber can be evenly distributed, thereby improving heat dissipation efficiency of a housing. This application provides a housing, including: a first support plate, a second support plate, and a vapor chamber, where the first support plate, the vapor chamber, and the second support plate are laminated, and the vapor chamber is located between the first support plate and the second support plate, and is connected to the first support plate and the second support plate.

In conclusion, in this application, the vapor chamber is disposed between the first support plate and the second support plate, so that a heat dissipation effect of the housing can be improved. In addition, the vapor chamber further has a heat equalization function. The heat exchange between the main heat dissipation channel and the auxiliary heat dissipation channel allows the heat transferred from the first support plate to the vapor chamber to be evenly distributed to an entire vapor chamber, thereby improving heat dissipation efficiency of the housing, and improving performance and service life of an electronic device. In addition, the vapor chamber has high strength, and the vapor chamber is disposed between the first support plate and the second support plate, so that strength of the housing can be improved, and flatness of the housing can be reduced.

BRIEF DESCRIPTION OF DRAWINGS

To describe technical solutions in embodiments of this application or in the background more clearly, the following describes accompanying drawings required in embodiments of this application or in the background.

FIG. 1 is an exploded view of a housing according to a second embodiment of this application.

DESCRIPTION OF EMBODIMENTS

Embodiments of this application are described below with reference to accompanying drawings in embodiments of this application.

Figure 1:
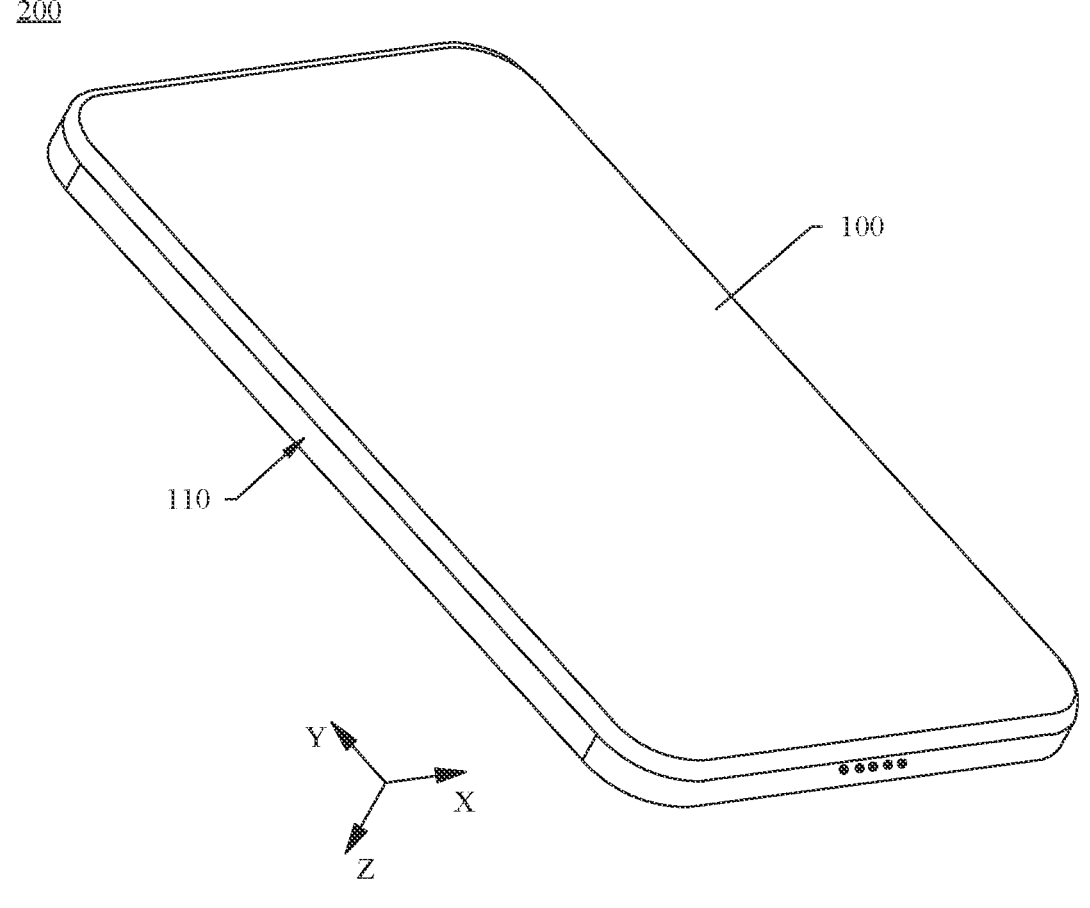
FIG. 1 is a schematic diagram of a structure of an electronic device according to this application.

FIG. 1 is a schematic diagram of a structure of an electronic device 200 according to this application.

The electronic device 200 includes but is not limited to a cellphone (cellphone), a notebook computer (notebook computer), a tablet personal computer (tablet personal computer), a laptop computer (laptop computer), a personal digital assistant (personal digital assistant), a wearable device (wearable device), or the like. The following uses an example in which the electronic device 200 is a mobile phone for description.

The electronic device 200 includes a body 110 and a housing 100, and the housing 100 is mounted in the body 110. The housing 100 is a battery cover of the electronic device 200. The following describes a structure of the housing 100 in detail.

For ease of description, in this application, a width direction of the housing 100 is defined as an X direction, a length direction is defined as a V direction, and a thickness direction is defined as a Z direction. The X direction, the Y direction, and the Z direction are perpendicular to each other.

Figure 2:
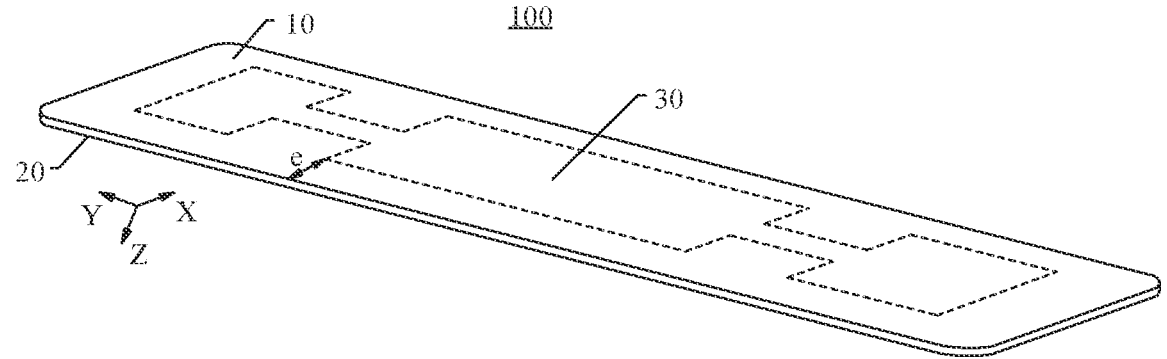
FIG. 2 is a schematic diagram of a structure of a housing in the electronic device shown in FIG. 1.
Figure 3:
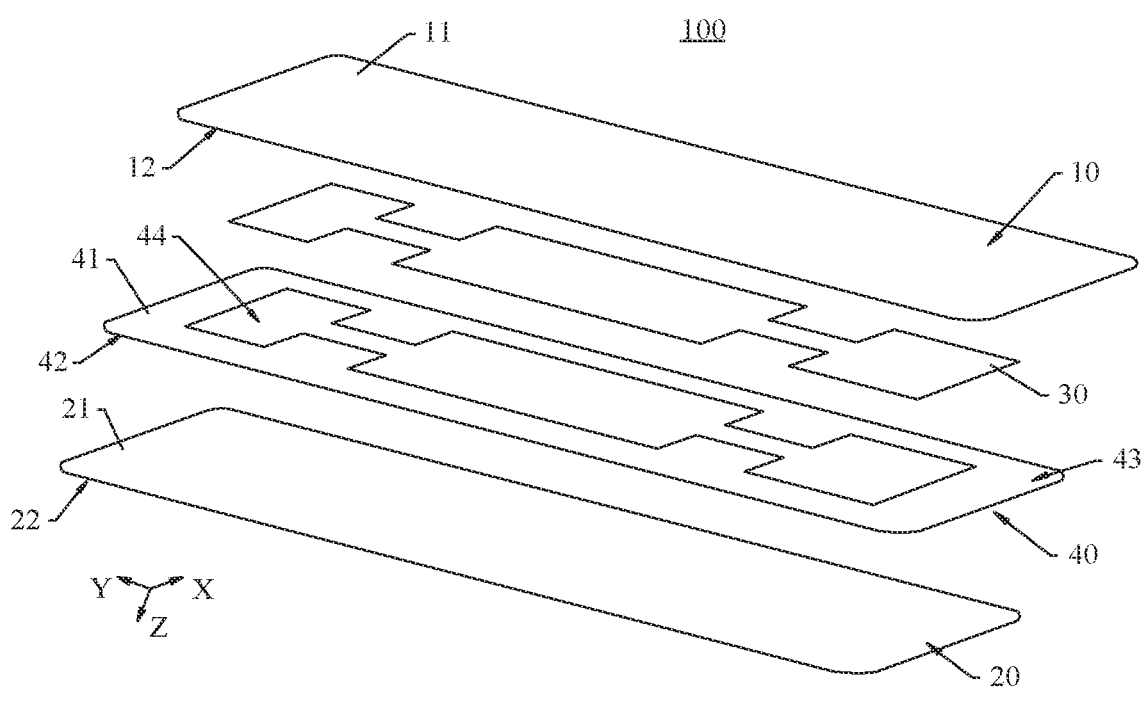
FIG. 3 is an exploded view of the housing shown in FIG. 2.

Referring to FIG. 2 and FIG. 3, FIG. 2 is a schematic diagram of a structure of the housing 100 in the electronic device shown in FIG. 1, and FIG. 3 is an exploded view of the housing 100 shown in FIG. 2.

In an embodiment of this application, the housing 100 includes a first support plate 10, a second support plate 20, a vapor chamber 30, and a protection plate 40. The vapor chamber 30 is embedded in the protection plate 40; the first support plate 10, the protection plate 40, and the second support plate 20 are laminated; and the protection plate 40 and the vapor chamber 30 are located between the first support plate 10 and the second support plate 20, and are connected to the first support plate 10 and the second support plate 20.

The first support plate 10 is a rectangular thin plate. The first support plate 10 includes a first upper surface 11 and a first lower surface 12, and the first upper surface 11 is disposed opposite to the first lower surface 12. In this embodiment, the first support plate 10 is prepared from a polyethylene terephthalate (PET) material. In another embodiment, the first support plate may also be prepared from polymethyl methacrylate (acrylic, PMMA), polycarbonate (PC) or another type of plastic. The first support plate 10 prepared from plastic has a light weight, which facilitates lightening and thinning of the electronic device 200. Alternatively, the first support plate may be prepared from glass or ceramic material.

The housing 100 further includes a decorative layer (not shown in the figure), and the decorative layer is located on the first upper surface 11. In this embodiment, the decorative layer is a paint layer. The decorative layer is formed on the first upper surface 11 by using a non-conductive vacuum metalization (Non conductive vacuum metalization, NCVM) technology. The decorative layer formed by using the NCVM (NCVM) technology has a metal coating mirror effect, has a rich color, and can improve aesthetic appearance of the housing 100. In addition, the decorative layer formed by using the NCVM technology has a high resistivity, which can avoid affecting communication performance of the electronic device 200. In another embodiment, the decorative layer is formed on the first upper surface 11 by using a spraying process, so as to simplify a process of forming the decorative layer. In this embodiment, the decorative layer is disposed, so that the aesthetic appearance of the housing 100 can be improved, and handfeel of a user can be further improved. In addition, the decorative layer may further protect the first support plate 10.

Still referring to FIG. 3, the second support plate 20 is a rectangular thin plate. A size and a shape of the second support plate 20 are the same as those of the first support plate 10. The second support plate 20 includes a second upper surface 21 and a second lower surface 22, and the second upper surface 21 is disposed opposite to the second lower surface 22. In this embodiment, the second support plate 20 is prepared from a polyethylene terephthalate (PET) material. In another embodiment, the second support plate 20 may also be prepared from polymethyl methacrylate (acrylic, PMMA), polycarbonate (PC) or another type of plastic. The second support plate 20 prepared from plastic has a light weight, which facilitates lightening and thinning of the electronic device 200. In an implementation, the second support plate 20 may also be prepared from glass or ceramic material.

The housing 100 further includes an ink layer (not shown in the figure), and the ink layer is located on the second lower surface 22. In this embodiment, the ink layer is formed on the second lower surface 22 by using a spraying process. Disposing the ink layer can improve the aesthetic appearance of the housing 100, and at the same time, the ink layer protects the second support plate 20.

In an implementation, two opposite sides of the vapor chamber 30 are connected to the first lower surface 12 and the second upper surface 21. In another implementation, the vapor chamber 30 is embedded in the first lower surface 12 and/or the second upper surface 21, and embedding means that the vapor chamber 30 is partially embedded. A specific implementation is described below.

Figure 4:
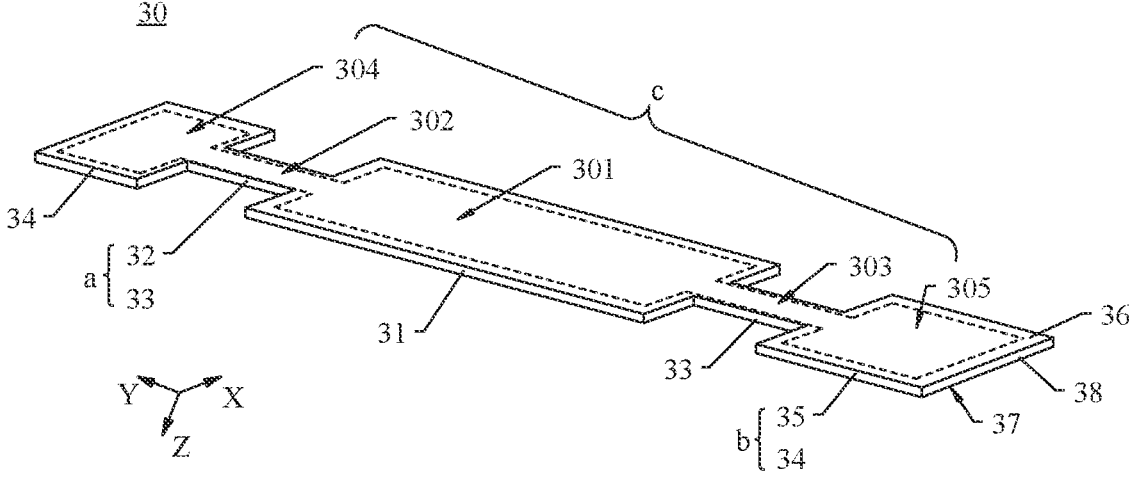
FIG. 4 is an enlarged schematic diagram of a vapor chamber in the housing shown in FIG. 2.

FIG. 4 is a schematic diagram of an enlarged structure of the vapor chamber 30 in the housing 100 shown in FIG. 2.

In this embodiment, a material of the vapor chamber 30 is copper. In another embodiment, a material of the vapor chamber 30 may also be a carbon fiber. The vapor chamber prepared from the copper or carbon fiber has excellent heat conductivity; high strength, and good ductility. When the vapor chamber 30 is applied to the housing 100, heat dissipation performance, strength, and toughness of the housing 100 can be improved. In another embodiment, a material of the vapor chamber 30 may also be graphene or graphite flake.

The vapor chamber 30 includes a main body section 31, a guide section a, and an auxiliary heat dissipation section b. In this embodiment, the main body section 31 is rectangular. In another embodiment, the main body section 31 may also be in a circular shape, a diamond shape, or another shape. The guide section a includes a first guide section 32 and a second guide section 33. In this embodiment, both the first guide section 32 and the second guide section 33 are rectangular, and widths of both the first guide section 32 and the second guide section 33 are less than a width of the main body section 31. The "width" herein refers to a size along the X direction. That is, both a size of the first guide section 32 and a size of the second guide section 33 along the X direction are less than a size of the main body section 31 along the X direction. The first guide section 32 and the second guide section 33 are respectively located at two opposite ends of the main body section 31 along the Y direction, and are connected to the main body section 31.

The auxiliary heat dissipation section b includes a first auxiliary heat dissipation section 34 and a second auxiliary heat dissipation section 35. Widths of both the first auxiliary heat dissipation section 34 and the second auxiliary heat dissipation section 35 are greater than a width of the guide section a. That is, both a size of the first auxiliary heat dissipation section 34 and a size of the second auxiliary heat dissipation section 35 along the X direction are greater than a size of the guide section a along the X direction. The first auxiliary heat dissipation section 34 is connected to an end that is of the first guide section 32 and that is away from the main body section 31, and the second auxiliary heat dissipation section 35 is connected to an end that is of the second guide section 33 and that is away from the main body section 31.

In this embodiment, widths of the first auxiliary heat dissipation section 34 and the second auxiliary heat dissipation section 35 are the same as the width of the main body section 31. The first auxiliary heat dissipation section 34, the first guide section 32, the main body section 31, the second guide section 33, and the second auxiliary heat dissipation section 35 are successively arranged and are in a flat structure, and a length of the vapor chamber 30 is a sum of lengths of the first auxiliary heat dissipation section 34, the first guide section 32, the main body section 31, the second guide section 33, and the second auxiliary heat dissipation section 35, In another embodiment, the widths of the first auxiliary heat dissipation section 34 and the second auxiliary heat dissipation section 35 may be different from the width of the main body section 31.

Still referring to FIG. 4, the vapor chamber 30 is a hollow plate-like structure. The vapor chamber 30 includes a top wall 36, a bottom wall 37, and a side wall 38. The top wall 36 and the bottom wall 37 are disposed opposite to each other, and are laminated and spaced apart from each other along the Z direction. The side wall 38 is connected to the top wall 36 and the bottom wall 37. The top wall 36, the bottom wall 37, and the side wall 38 are jointly enclosed to form a sealed heat dissipation channel c.

The heat dissipation channel c includes a main heat dissipation channel 301, a first guide channel 302, a second guide channel 303, a first auxiliary heat dissipation channel 304, and a second auxiliary heat dissipation channel 305. The main heat dissipation channel 301 corresponds to the main body section 31 of the vapor chamber 30, that is, the main heat dissipation channel 301 is disposed inside the main body section 31. The first guide channel 302 corresponds to the first guide section 32, that is, the first guide channel 302 is disposed inside the first guide section 32. The second guide channel 303 corresponds to the second guide section 33, that is, the second guide channel 303 is disposed in the second guide section 33. The first auxiliary heat dissipation channel 304 corresponds to the first auxiliary heat dissipation section 34, that is, the first auxiliary heat dissipation channel 304 is disposed in the first auxiliary heat dissipation section 34. The second auxiliary heat dissipation channel 305 corresponds to the second auxiliary heat dissipation section 35, that is, the second auxiliary heat dissipation channel 305 is disposed in the second auxiliary heat dissipation section 35. Widths of the first auxiliary heat dissipation channel 304 and the second auxiliary heat dissipation channel 305 are the same as a width of the main heat dissipation channel 301, and a width of the first guide channel 302 is less than widths of the main heat dissipation channel 301, the first auxiliary heat dissipation channel 304, and the second auxiliary heat dissipation channel 305.

Figure 5:
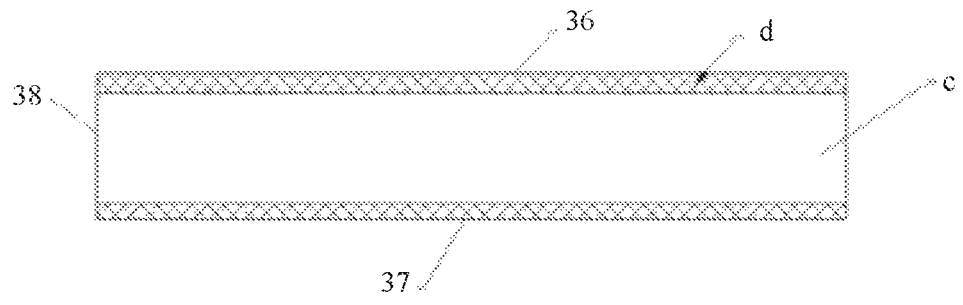
FIG. 5 is a sectional view of the vapor chamber shown in FIG. 4.

FIG. 5 is a sectional view of the vapor chamber 30 shown in FIG. 4.

In this embodiment, capillary structures d are disposed on inner surfaces of the top wall 36 and the bottom wall 37, and the capillary structures d are located in an entire heat dissipation channel c. That is, the capillary structures d are disposed in the main heat dissipation channel 301, the first guide channel 302, the second guide channel 303, the first auxiliary heat dissipation channel 304, and the second auxiliary heat dissipation channel 305. The capillary structure d is filled with coolant. In this embodiment, the capillary structure d is a porous medium that uses copper as a substrate, such as, copper mesh, copper powder sintering, and copper foam. In another embodiment, the capillary structure d may alternatively be another porous microstructure.

When heat generated by a heat source of the electronic device 200 is conducted to the vapor chamber 30, a temperature in a local area of the vapor chamber 30 increases, and a high-temperature area and a low-temperature area are formed on the vapor chamber 30. The coolant in the capillary structure d located in the high-temperature area is heated and vaporized in a vacuum environment, absorbs heat and rapidly expands, and the vaporized coolant rapidly fills an entire heat dissipation channel c. After the coolant in the capillary structure d in the high-temperature area is vaporized, the coolant in the capillary structure d in the low-temperature area is transferred to the capillary structure d in the high-temperature area, and is vaporized. When the vaporized coolant is in contact with the low-temperature area, the coolant may condense, and heat accumulated during vaporization is released during a condensation process. Therefore, heat in the high-temperature area of the vapor chamber 30 is conducted to the low-temperature area.

In addition, the condensed coolant is absorbed by the capillary structure d located in the low-temperature area, passes through the capillary structure d, and then returns to the capillary structure d located in the high-temperature area. The coolant entering, the high-temperature area from the low-temperature area continues to vaporize, returns to the low-temperature area, and condenses in the low-temperature area. After continuous circulation, in a process of vaporization and condensation, the coolant continuously transfers heat in the high-temperature area of the vapor chamber 30 to the low-temperature area, so as to achieve a heat equalization effect, so that heat of the vapor chamber 30 is evenly distributed in the entire vapor chamber 30, thereby improving a heat dissipation effect. It should be noted that the capillary structure d may transfer the coolant from the low-temperature area to the high-temperature area by using capillarity of a microstructure of the capillary structure d.

Specifically, in a normal temperature state, the coolant is in a liquid state and is located in the capillary structure d. When a temperature of the main body section 31 is higher than a temperature of the auxiliary heat dissipation section b, that is, when the main heat dissipation channel 301 is a high-temperature area and the auxiliary heat dissipation channel is a low-temperature area, the coolant in the capillary structure d in the main body section 31 is heated and vaporized, and enters the first auxiliary heat dissipation channel 304 through the first guide channel 302, After the coolant in the capillary structure d in the main body section 31 is vaporized, the coolant in the capillary structure d in the auxiliary heat dissipation section b is transferred to the capillary structure d in the main body section 31, and is vaporized. The vaporized coolant enters the first auxiliary heat dissipation channel 304 through the first guide channel 302. After entering the first auxiliary heat dissipation channel 304, the vaporized coolant condenses and releases heat, so as to transfer heat of the main body section 31 to the first auxiliary heat dissipation section 34. In addition, the coolant in the capillary structure d in the main body section 31 is heated and vaporized, and may further enter the second auxiliary heat dissipation channel 305 through the second guide channel 303, and condenses in the second auxiliary heat dissipation section 35, so as to transfer heat to the second auxiliary heat dissipation section 35.

The coolant condensed in the first auxiliary heat dissipation channel 304 is absorbed by a capillary structure d located in the first auxiliary heat dissipation section 34, and is transferred to the capillary structure d located in the main body section 31. The coolant condensed in the second auxiliary heat dissipation channel 305 is absorbed by a capillary structure d located in the second auxiliary heat dissipation section 35 and is transferred to the capillary structure d located in the main body section 31. The coolant entering the capillary structure d in the main body section 31 continues to vaporize, and is transferred to the first auxiliary heat dissipation channel 304 and the second auxiliary heat dissipation channel 305. In a vaporization and condensation circulation process of the coolant, the heat in the main body section 31 is continuously transferred to the first auxiliary heat dissipation section 34 and the second auxiliary heat dissipation section 35 until a temperature of the entire vapor chamber 30 is consistent, so that the heat of the vapor chamber 30 is evenly distributed, thereby improving a heat dissipation effect.

When a temperature of the first guide section 32 is lower than the temperature of the main body section 31, the vaporized coolant also condenses in the first guide channel 302, and is transferred to the main heat dissipation channel 301 by using the capillary structure d. When a temperature of the second guide section 33 is lower than the temperature of the main body section 31, the vaporized coolant also condenses in the second guide channel 303, and is transferred to the main heat dissipation channel 301 by using the capillary structure d. That is, the heat in the main body section 31 may further be transferred to the first guide section 32 and the second guide section 33, so that equalization of heat distribution can be further improved, thereby improving the heat dissipation effect.

In this embodiment, because widths of both the first guide channel 302 and the second guide channel 303 are less than the width of the main heat dissipation channel 301, the coolant vaporized in the main heat dissipation channel 301 flows more quickly when passing through the first guide channel 302 and the second guide channel 303, so that a heat equalization speed can be improved, and heat dissipation efficiency can be further improved.

When both a temperature of the first auxiliary heat dissipation section 34 and a temperature of the second auxiliary heat dissipation section 35 are higher than the temperature of the main body section 31, that is, when the auxiliary heat dissipation channel is a high-temperature area and the main heat dissipation channel 301 is a low-temperature area, the coolant in the capillary structured located in the first auxiliary heat dissipation section 34 is heated and vaporized, and enters the main heat dissipation channel 301 through the first guide channel 302. After the coolant in the capillary structure d located in the first auxiliary heat dissipation section 34 is vaporized, the coolant in the capillary structure d located in the main body section 31 is transferred to the capillary structure d located in the first auxiliary heat dissipation section 34, and is vaporized. The vaporized coolant continues to enter the main heat dissipation channel 301 through the first guide channel 302. In addition, coolant in the capillary structure d located in the second auxiliary heat dissipation section 35 is heated and vaporized, and enters the main heat dissipation channel 301 through the second guide channel 303. After the coolant in the capillary structure d located in the second auxiliary heat dissipation section 35 is vaporized. the coolant in the capillary structure d located in the main body section 31 is transferred to the capillary structure d located in the second auxiliary heat dissipation section 35, and is vaporized. The vaporized coolant continues to enter the main heat dissipation channel 301 through the second guide channel 303. After entering the main heat dissipation channel 301, the vaporized coolant condenses and releases heat, so as to transfer heat of the first auxiliary heat dissipation section 34 and the second auxiliary heat dissipation section 35 to the main body section 31.

The coolant condensed in the main heat dissipation channel 301 is absorbed by the capillary structure d located in the main body section 31, and is transferred to capillary structures d located in the first auxiliary heat dissipation section 34 and the second auxiliary heat dissipation section 35; and the coolant entering, the capillary structures d located in the first auxiliary heat dissipation section 34 and the second auxiliary heat dissipation section 35 continues to vaporize, and is transferred to the main heat dissipation channel 301. In a vaporization and condensation circulation process of the coolant, the heat of the first auxiliary heat dissipation section 34 and the second auxiliary heat dissipation section 35 is continuously transferred to the main body section 31 until the temperature of the entire vapor chamber 30 is consistent, so that the heat of the vapor chamber 30 is evenly distributed, thereby improving the heat dissipation effect.

When the temperature of the first guide section 32 is lower than a temperature of the first auxiliary heat dissipation section 34, the vaporized coolant also condenses in the first guide channel 302, and is transferred to the first auxiliary heat dissipation channel 304 by using the capillary structure d. When the temperature of the second guide section 33 is lower than a temperature of the second auxiliary heat dissipation section 35, the vaporized coolant also condenses in the second guide channel 303, and is transferred to the second auxiliary heat dissipation channel 305 by using the capillary structure d. That is, the heat of the first auxiliary heat dissipation section 34 and the second auxiliary heat dissipation section 35 may be further transferred to the first guide section 32 and the second guide section 33, so that equalization of heat distribution can be further improved, thereby improving the heat dissipation effect.

In this embodiment, because the widths of both the first guide channel 302 and the second guide channel 303 are less than the width of the main heat dissipation channel 301, the coolant vaporized in the first auxiliary heat dissipation channel 304 flows more quickly when passing through the first guide channel 302, and the coolant vaporized in the second auxiliary heat dissipation channel 305 flows more quickly when passing through the second guide channel 303, so that a heat equalization speed can be improved, and heat dissipation efficiency can be further improved.

In an implementation, the main heat dissipation channel 301 includes a low-temperature area and a high-temperature area, and the coolant may undergo a gas-liquid circulation between the low-temperature area and the high-temperature area in the main heat dissipation channel 301, so that heat in the high-temperature area is transferred to the low-temperature area, and the heat in the main body section 31 is evenly distributed. Alternatively, the auxiliary heat dissipation channel includes a low-temperature area and a high-temperature area, and the coolant may undergo a gas-liquid circulation between the low-temperature area and the high-temperature area in the auxiliary heat dissipation channel, so that heat in the high-temperature area is transferred to the low-temperature area, and heat in the auxiliary heat dissipation section 1) is evenly distributed.

Figure 6:
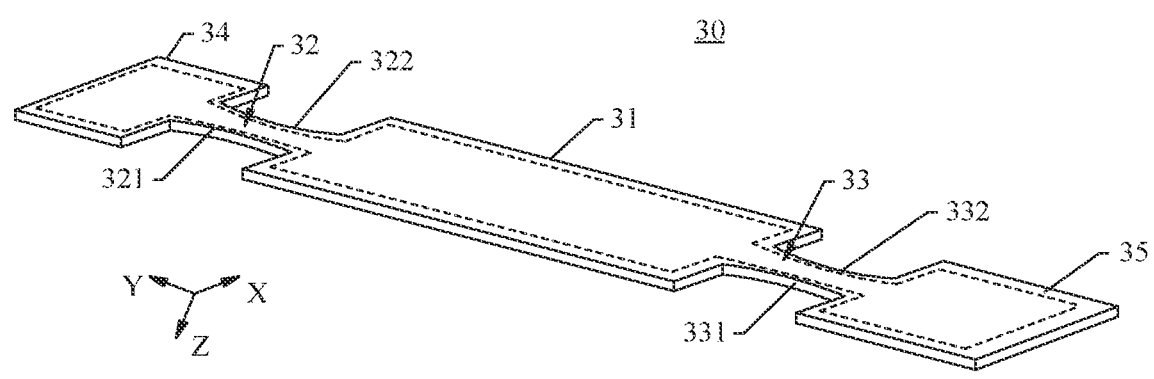
FIG. 6 is a schematic diagram of a structure of a vapor chamber in a housing according to another implementation of this application.

FIG. 6 is a schematic diagram of a structure of a vapor chamber 30 in a housing according to another implementation of this application.

In this embodiment, the first guide section 32 and the second guide section 33 may also be in a curved shape. The first guide section 32 includes a first side edge 321 and a second side edge 322, and the first side edge 321 and the second side edge 322 are disposed opposite to each other. Both the first side edge 321 and the second side edge 322 are arc-shaped. Middle areas of the first side edge 321 and the second side edge 322 protrude toward inside of the first guide channel 302. That is, a width of the first guide section 32 gradually decreases from two ends to a middle part. The second guide section 33 includes a third side edge 331 and a fourth side edge 332, and the third side edge 331 and the fourth side edge 332 are disposed opposite to each other. Both the third side edge 331 and the fourth side edge 332 are arc-shaped. Middle areas of the third side edge 331 and the fourth side edge 332 protrude toward inside of the second guide channel 303. That is, a width of the second guide section 33 gradually decreases from two ends to a middle part.

In this embodiment, shapes and sizes of both the first auxiliary heat dissipation section 34 and the second auxiliary heat dissipation section 35 of the vapor chamber 30 are the same, and shapes and sizes of both the first guide section 32 and the second guide section 33 are the same. That is, the vapor chamber is symmetrical in both the X direction and the Y direction. In another embodiment, lengths and widths of both the first guide section 32 and the second guide section 33 may be different, and shapes thereof may be different. Shapes and sizes of both the first auxiliary heat dissipation section 34 and the second auxiliary heat dissipation section 35 may alternatively be different.

In an implementation, the vapor chamber 30 may alternatively be a rectangular plate-like structure or a circular plate-like structure. The vapor chamber 30 may further be a cross-shaped structure. Certainly, the vapor chamber 30 may alternatively be a single-layer structure. When the vapor chamber 30 is a single-layer structure, heat transferred to the vapor chamber 30 is directly exchanged with an external space to dissipate the heat to the outside.

Referring to FIG. 3, the housing 100 further includes a protection plate 40, The protection plate 40 is a thin plate. In this embodiment, the protection plate 40 is prepared from polymethyl methacrylate (PMMA), In another embodiment, the protection plate 40 is prepared from polymethyl methacrylate (acrylic, PMMA), polycarbonate (PC), or another type of plastic.

The protection plate 40 includes a first surface 41 and a second surface 42, and the first surface 41 and the second surface 42 are disposed opposite to each other. The protection plate 40 includes a main body 43. The main body 43 of the protection plate 40 is provided with an accommodation groove 44, where the accommodation groove 44 runs through the first surface 41 and the second surface 42, and the main body 43 surrounds a peripheral edge of the accommodation groove 44. A shape of the accommodation groove

44 matches a shape of the vapor chamber 30. That is, the vapor chamber 30 may be mounted in the accommodation groove 44 and fastened.

Figure 7:
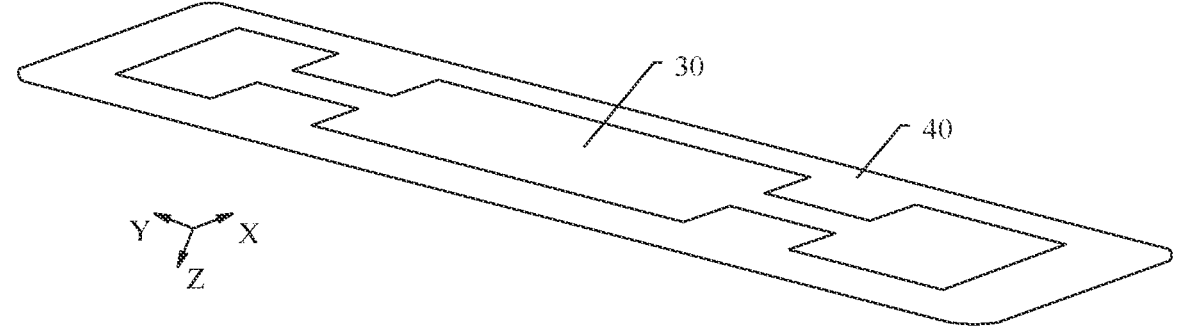
FIG. 7 is a schematic diagram of a structure of a part of the housing shown in FIG. 2.

FIG. 7 is a schematic diagram of a structure of a part of the housing 100 shown in FIG. 5.

The vapor chamber 30 is mounted in the accommodation groove 44 of the protection plate 40, and is fixedly connected to a side wall of the accommodation groove 44. Specifically, when the vapor chamber 30 is mounted in the protection plate 40, the vapor chamber 30 may be first placed in the accommodation groove 44 of the protection plate 40 and the vapor chamber 30 is mounted in the accommodation groove 44 by using a press-fitting process. Then, an adhesive is applied between a side wall of the vapor chamber 30 and the side wall of the accommodation groove 44 so that the vapor chamber 30 is fixedly connected to the protection plate 40.

In the press-fitting process, a press-fitting mold may be heated, so that the protection plate 40 is softened or deformed, and a shape of the accommodation groove 44 of the protection plate 40 can be more suitable for the shape of the vapor chamber 30, to increase stability of connecting the vapor chamber 30 to the protection plate 40.

In this embodiment, a protection plate 40 is disposed, and the vapor chamber 30 is mounted in the accommodation groove 44 of the protection plate 40, so that the protection plate can protect the vapor chamber 30. In addition, when the vapor chamber 30 is mounted between the first support plate 10 and the second support plate 20, the protection plate 40 may further avoid exposure of the vapor chamber 30 from an edge area, which does not affect an appearance design of the housing 100 and improves aesthetic appearance of the housing 100.

Referring to FIG. 3, the housing 100 further includes a first bonding member and a second bonding member (not shown in the figure). The first bonding member is located between the first support plate 10 and the protection plate 40, and adheres to the first lower surface 12 and the first surface 41. The second bonding member is located between the second support plate 20 and the protection plate 40, and adheres to the second upper surface 21 and the second surface 42. In this embodiment, both the first bonding member and the second bonding member are OCA optical clear adhesive. In another embodiment, the first bonding member and the second bonding member may also be an adhesive, a double-sided adhesive tape, or any other adhesive, provided that a bonding function can be implemented.

In another implementation, the housing 100 may alternatively be an integrally formed component, so as to increase structural stability of the housing 100. Specifically, the housing 100 may be prepared by using a multi-step injection molding process.

In this embodiment, the vapor chamber 30 is disposed between the first support plate and the second support plate 20, so that a heat dissipation effect of the housing 100 can be improved. When the housing 100 is mounted in the body 110, heat generated when an internal electronic component such as a battery or a circuit board of the electronic device 200 works is transferred to the vapor chamber 30 by using the second support plate 20, then is transferred to the first support plate 10 by using the vapor chamber 30, and then is transferred to the outside by using the first support plate 10, thereby providing a heat dissipation function. In addition, the vapor chamber 30 further has a heat equalization function. The heat transferred from the first support plate 10 to the vapor chamber 30 is evenly distributed to an entire vapor chamber 30, thereby improving heat dissipation efficiency of the housing 100, and improving performance and service life of the electronic device 200.

A thickness of the housing 100 is 0.5-0.65 mm. That is, a size of the housing 100 in the Z direction is 0.5-0.65 mm. In this embodiment, a thickness of the housing 100 is 0.55 mm. A puncture strength of the housing 100 with a thickness of 0.55 mm is 180N.

In this embodiment, the vapor chamber 30 has high strength. The vapor chamber 30 is disposed between the first support plate 10 and the second support plate 20, so that strength of the housing 100 can be improved. That is, the housing 100 is ultra-thin, and a strength requirement of the housing 100 can be ensured. In addition, the vapor chamber 30 has high rigidity, and may not easily deform, so that flatness of the housing 100 can be reduced. In addition, the vapor chamber 30 further has ductility, so that toughness of the housing 100 can be improved.

In this embodiment, there is a safe distance e between the vapor chamber 30 and an edge of the second support plate 20. That is, a size of the vapor chamber 30 in the X direction is less than a size of the second support plate 20 in the X direction, a size of the vapor chamber 30 in the Y direction is less than a size of the second support plate 20 in the Y direction, and an outer peripheral edge of the vapor chamber 30 and an outer peripheral edge of the second support plate 20 are spaced apart from each other. When an antenna of the electronic device 200 is a frame antenna, a safe distance e is set between the vapor chamber 30 and the edge of the second support plate 20, so that communication performance of the frame antenna of the electronic device 200 can be prevented from being affected by the vapor chamber 30 of a metal material.

Figure 8:
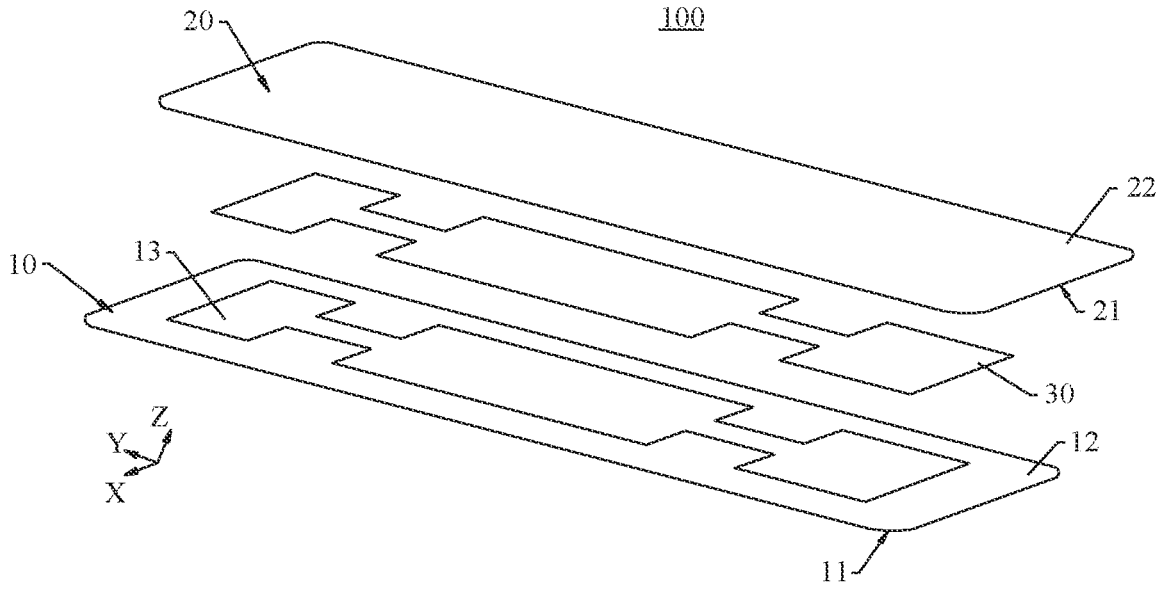

FIG. 8 is a schematic exploded diagram of a housing 100 according to a second embodiment of this application.

A difference from the foregoing embodiment is that the first support plate 10 is provided with a mounting groove 13, and the mounting groove 13 is recessed on the first lower surface 12. A shape of the mounting groove 13 matches a shape of the vapor chamber 30. The vapor chamber 30 is mounted in the mounting groove 13.

The housing 100 further includes a third bonding member (not shown in the figure). The third bonding member is located between the first support plate 10 and the second support plate 20, and adheres to the first lower surface 12 and the second upper surface 21, so as to implement a fixed connection between the first support plate 10 and the second support plate 20.

In this embodiment, the mounting groove 13 is directly disposed on the first support plate 10, and the vapor chamber 30 is mounted in the mounting groove 13. No additional protection plate 40 needs to be disposed, thereby simplifying a structure of the housing 100 and further reducing weight of the housing 100.

In an implementation, the housing 100 is an integrally formed component. In this implementation, materials of both the first support plate 10 and the second support plate 20 are polycarbonate. The housing 100 is prepared by using a two-step injection molding process. Specifically, the first support plate 10 with the mounting groove 13 is first formed through injection molding, then the vapor chamber 30 is mounted in the mounting groove 13, and then the second support plate 20 is formed on the first lower surface 12 of the first support plate 10 through injection molding. A structure of the housing 100 prepared by using the two-step injection molding process is stable.

It should be noted that when the materials of the first support plate 10 and the second support plate 20 are mate-rials with a relatively high melting temperature, such as polyethylene terephthalate (PET) and polymethyl methacry-late (acrylic, PMMA), a bonding manner is generally used to implement a fixed connection, so as to simplify a process and reduce costs. When the materials of the first support plate 10 and the second support plate 20 are materials with a relatively low melting temperature, such as polycarbonate (PC), a polycarbonate, acrylonitrile-butadiene-styrene copo-lymer, and mixture (PC/ABS), an injection molding process is generally used to implement a connection, so as to improve structural stability of the housing 100.

In a third embodiment of this application, a difference from the second embodiment is that a mounting groove is disposed on the second support plate 20, and the mounting groove is recessed on the second upper surface 21. A shape of the mounting groove 13 matches a shape of the vapor chamber 30. The vapor chamber 30 is mounted in the mounting groove.

In a fourth embodiment of this application, a difference from the second embodiment is that a first mounting groove is disposed on the first support plate 10, and the first mounting groove is recessed on the first lower surface 12. A second mounting groove is disposed on the second support plate 20, and the second mounting groove is recessed on the second upper surface 21. A shape of the first mounting groove is the same as a shape of the second mounting groove. The first support plate 10 is connected to the second support plate 20, and the first mounting groove and the second mounting groove are connected to form a mounting groove. A shape and a size of the mounting groove are the same as those of the vapor chamber 30.

In an mounting process, the vapor chamber 30 is first mounted in the first mounting groove, then the second support plate 20 is buckled with the first lower surface 12 of the first support plate 10, and a part that is of the vapor chamber 30 and that is exposed to the first mounting groove is located in the second mounting groove. In addition, the first lower surface 12 and the second upper surface 21 are bonded by using the third bonding member, so that the first support plate 10 is fixedly connected to the second support plate 20, and the housing 100 is fixedly connected. Alter-natively, the housing 100 in this implementation may be connected through two-step injection molding.

Referring back to FIG. 1, the electronic device 200 provided in this application includes a body 110 and the foregoing housing 100. The housing 100 is a battery cover of the electronic device 200. The housing 100 provided in this application has a small thickness and a light weight, thereby facilitating lightness and thinning of the electronic device 200. In addition, strength and toughness of the housing 100 are high, which improves anti-drop perfor-mance and durability of the electronic device 200. In addi-tion, flatness of the housing 100 is small, so that appearance smoothness of the electronic device 200 is improved, and user experience is improved.

Referring to FIG. 4 together, the body 110 is provided with a first heating element and a second heating element (not shown in the figure). In this embodiment, the first heating element is a battery, and the second heating element is an electronic component such as a main board, a CPU, or a small board. When the housing 100 is mounted in the body 110, the housing 100 is directly opposite to the first heating element and the second heating element. In this embodi-ment, the main body section 31 of the vapor chamber 30 is directly opposite to the first heating element, and the aux-iliary heat dissipation section b is directly opposite to the second heating element. Heat generated by the first heating element is transferred to the main body section 31 of the vapor chamber 30 by using the second support plate 20. Heat generated by the second heating element is transferred to the auxiliary heat dissipation section b of the vapor chamber 30 by using the second support plate 20.

When the heat generated by the first heating element is greater than the heat generated by the second heating element, a temperature of the main body section 31 is higher than a temperature of the auxiliary heat dissipation section b. A part of heat of the main body section 31 is directly transferred to the first support plate 10 and then dissipated to the outside. A part of heat is absorbed by the coolant in the capillary structure d located in the main body section 31, and then the coolant is vaporized. The vaporized coolant is transferred to the first auxiliary heat dissipation channel 304 through the first guide channel 302, and condenses in the first auxiliary heat dissipation channel 304, and releases heal at the same time, so that the heat of the main body section 31 is transferred to the first auxiliary heat dissipation section 34, then is transferred to the first support plate 10 through the first auxiliary heat dissipation section 34, and then is dissipated to the outside through the first support plate 10, so as to reduce the temperature of the vapor chamber 30. In addition, the coolant vaporized in the main heat dissipation channel 301 may further be transferred to the second auxiliary heat dissipation channel 305 through the second guide channel 303, and condenses in the second auxiliary heat dissipation channel 305, and releases heat at the same time, so that the heat of the main body section 31 is transferred to the second auxiliary heat dissipation section 35, then is transferred to the first support plate 10 through the second auxiliary heat dissipation section 35, and then is dissipated to the outside through the first support plate 10, so as to further reduce the temperature of the vapor chamber 30.

When the heat generated by the second heating element is greater than the heat generated by the first heating element, a temperature of the auxiliary heat dissipation section 11 is higher than the temperature of the main body section 31. A part of heat of the auxiliary heat dissipation section b is directly transferred to the first support plate 10 and then dissipated to the outside. A part of heat is absorbed by the coolant in the capillary structure d located in the first auxiliary heat dissipation section 34, and then the coolant is vaporized. The vaporized coolant is transferred to the main heat dissipation channel 301 through the first guide channel 302, and condenses in the main heat dissipation channel 301, and releases heat at the same time, so that heat of the first auxiliary heat dissipation section 34 is transferred to the main body section 31. A part of heat is absorbed by the coolant in the capillary structure d located in the second auxiliary heat dissipation section 35, and then the coolant is vaporized. The vaporized coolant is transferred to the main heat dissipation channel 301 through the second guide channel 303, and condenses in the main heat dissipation channel 301, and releases heat at the same time, so that heat of the second auxiliary heat dissipation section 35 is transferred to the main body section 31. Heat transferred to the main body section 31 is then transferred to the first support plate 10, and then is dissipated from the first support plate 10 to the outside, thereby reducing the temperature of the vapor chamber 30.

In another embodiment, the first heating element may alternatively be an electronic component such as a main board, a CPU, or a small board, and the second heating element is a battery. Mounting positions of the battery, main board, CPU, and small board may also be adjusted based on actual conditions. In summary, the heat transferred to the vapor chamber 30 may be evenly distributed in the entire vapor chamber 30, so that a heat dissipation speed of the vapor chamber 30 can be improved, thereby improving heat dissipation performance of the electronic device 200 and user experience. It should be noted that "even" herein may be fully even, or a small amount of deviation may be allowed.

The foregoing descriptions are merely some embodiments and implementations of this application, but the protection scope of this application is not limited thereto. Any person skilled in the art can easily conceive modifications or replacements within the technical scope of this application, and these modifications or replacements shall fall within the protection scope of this application. Therefore, the protection scope of this application shall be subject to the protection scope of claims.

What is claimed is:

1. A housing configured as a battery cover of an electronic device, the housing comprising:
    a first support plate;
    a second support plate;
    a vapor chamber located between and connected to the first support plate and the second support plate, wherein the vapor chamber comprises a top wall, a bottom wall, and a side wall; and
    a heat dissipation channel disposed on the vapor chamber, the heat dissipation channel comprising:
    a main heat dissipation channel;
    a first auxiliary heat dissipation channel connected to the main heat dissipation channel;
    a second auxiliary heat dissipation channel connected to the main heat dissipation channel;
    a first guide channel, wherein one end of the first guide channel is connected to the main heat dissipation channel and another end of the first guide channel is connected to the first auxiliary heat dissipation channel; and
    a second guide channel, wherein one end of the second guide channel is connected to the main heat dissipation channel and another end of the second guide channel is connected to the second auxiliary heat dissipation channel,
    wherein the main heat dissipation channel and the auxiliary heat dissipation channels are configured such that a) when the main heat dissipation channel is a high-temperature area and the auxiliary heat dissipation channels are low-temperature areas, heat is transferred from the main heat dissipation channel to the auxiliary heat dissipation channels, and b) when the main heat dissipation channel is a low-temperature area and the auxiliary heat dissipation channels are high-temperature areas, heat is transferred from the auxiliary heat dissipation channels to the main heat dissipation channel,
    wherein a first capillary structure is disposed in the heat dissipation channel on an inner surface of the top wall of the vapor chamber, and wherein a second capillary structure is disposed in the heat dissipation channel on an inner surface of the bottom wall of the vapor chamber, and
    wherein the first support plate, the vapor chamber, and the second support plate are laminated.

2. The housing of claim 1, wherein the vapor chamber is filled with coolant, and the coolant is configured to be vaporized in the high-temperature area and condensed in the low-temperature area to conduct heat in the high-temperature area to the low-temperature area.

3. The housing of claim 2, wherein the coolant is filled in one or more of the first and second capillary structures, and the coolant is configured to undergo a gas-liquid circulation in the main heat dissipation channel and the auxiliary heat dissipation channel to conduct heat in the high-temperature area to the low-temperature area.

4. The housing of claim 3, wherein a width of the first guide channel is less than widths of the main heat dissipation channel and the first auxiliary heat dissipation channel, and wherein a width of the second guide channel is less than widths of the main heat dissipation channel and the second auxiliary heat dissipation channel.

5. The housing of claim 1, wherein a material of the vapor chamber is copper, a carbon fiber, graphene, or graphite flake.

6. The housing of claim 1, wherein a thickness of the housing is 0.5-0.65 mm.

7. The housing of claim 1 further comprising a protection plate having an accommodation groove disposed thereon, wherein the vapor chamber is located in the accommodation groove, and is fixedly connected to the protection plate.

8. The housing of claim 1, wherein either a) a mounting groove is disposed on a surface of the first support plate that faces the vapor chamber, and the vapor chamber is located in the mounting groove, or b) a mounting groove is disposed on a surface of the second support plate that faces the vapor chamber, and the vapor chamber is located in the mounting groove.

9. The housing of claim 1, wherein a first mounting groove is disposed on a surface of the first support plate that faces the vapor chamber, a second mounting groove is disposed on a surface of the second support plate that faces the vapor chamber, and the first mounting groove is buckled with the second mounting groove to fasten the vapor chamber.

10. The housing of claim 1, wherein the housing is an integrally formed component.

11. The housing of claim 1, further comprising a decorative layer laminated on a surface of the first support plate that faces away from the vapor chamber.

12. The housing of claim 11, wherein the decorative layer is formed on the surface of the first support plate by a spraying or non-conductive coating process.

13. The housing of claim 1, further comprising an ink layer laminated on a surface of the second support plate that faces away from the vapor chamber.

14. An electronic device, comprising:
a body; and
a housing mounted in the body and configured as a battery cover of the electronic device, the housing comprising:
    a first support plate;
    a second support plate;
    a vapor chamber located between and connected to the first support plate and the second support plate, wherein the vapor chamber comprises a top wall, a bottom wall, and a side wall; and
    a heat dissipation channel disposed on the vapor chamber, the heat dissipation channel comprising:
    a main heat dissipation channel;
    a first auxiliary heat dissipation channel connected to the main heat dissipation channel;

a second auxiliary heat dissipation channel connected to the main heat dissipation channel;
    a first guide channel, wherein one end of the first guide channel is connected to the main heat dissipation channel and another end of the first guide channel is connected to the first auxiliary heat dissipation channel; and
    a second guide channel, wherein one end of the second guide channel is connected to the main heat dissipation channel and another end of the second guide channel is connected to the second auxiliary heat dissipation channel,
wherein the main heat dissipation channel and the auxiliary heat dissipation channels are configured such that a) when the main heat dissipation channel is a high-temperature area and the auxiliary heat dissipation channels are low-temperature areas, heat is transferred from the main heat dissipation channel to the auxiliary heat dissipation channels, and b) when the main heat dissipation channel is a low-temperature area and the auxiliary heat dissipation channels are high-temperature areas, heat is transferred from the auxiliary heat dissipation channels to the main heat dissipation channel,
wherein a first capillary structure is disposed in the heat dissipation channel on an inner surface of the top wall of the vapor chamber, and wherein a second capillary structure is disposed in the heat dissipation channel on an inner surface of the bottom wall of the vapor chamber, and
wherein the first support plate, the vapor chamber, and the second support plate are laminated.

15. The electronic device of claim 14, wherein a first heating element and a second heating element are mounted in the body, an amount of heat produced by the first heating element is greater than an amount of heat produced by the second heating element, and the high-temperature area is opposite to the first heating element.

16. The electronic device of claim 14, wherein the vapor chamber is filled with coolant, and the coolant is configured to be vaporized in the high-temperature area and condensed in the low-temperature area to conduct heat in the high-temperature area to the low-temperature area.

17. The electronic device of claim 16, wherein the coolant is filled in one or more of the first and second capillary structures, and the coolant is configured to undergo a gas-liquid circulation in the main heat dissipation channel and the auxiliary heat dissipation channel to conduct heat in the high-temperature area to the low-temperature area.

18. The electronic device of claim 17, wherein a width of the first guide channel is less than widths of the main heat dissipation channel and the first auxiliary heat dissipation channel, and wherein a width of the second guide channel is less than widths of the main heat dissipation channel and the second auxiliary heat dissipation channel.

19. The electronic device of claim 14, wherein a material of the vapor chamber is copper, a carbon fiber, graphene, or graphite flake.

20. The electronic device of claim 14, wherein a thickness of the housing is 0.5-0.65 mm.

* * * * *